(12) United States Patent
Bhattacharyya et al.

(10) Patent No.: US 6,724,027 B2
(45) Date of Patent: Apr. 20, 2004

(54) MAGNETIC SHIELDING FOR MRAM DEVICES

(75) Inventors: Manoj K. Bhattacharyya, Cupertino, CA (US); Darrel Bloomquist, Deceased, Meridian, ID (US), by Judy Bloomquist, legal representative; Anthony Peter Holden, Boise, ID (US); Sarah Morris Brandenberger, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/125,095

(22) Filed: Apr. 18, 2002

(65) Prior Publication Data

US 2003/0197211 A1 Oct. 23, 2003

(51) Int. Cl.[7] ................................. H01L 29/76
(52) U.S. Cl. ..................... 257/295; 257/659; 257/422; 257/778; 438/3; 438/421; 438/431; 428/332
(58) Field of Search ................. 428/332; 257/659, 257/422, 778; 438/3, 421, 431

(56) References Cited

U.S. PATENT DOCUMENTS

| 5,902,690 A | 5/1999 | Tracy et al. |
| 6,165,607 A * | 12/2000 | Yamanobe et al. ......... 428/332 |
| 6,219,212 B1 | 4/2001 | Gill et al. |

* cited by examiner

Primary Examiner—David Nelms
Assistant Examiner—Mai-Huong Tran

(57) ABSTRACT

A magnetic random access memory module includes a magnetic memory array. A permeable metal layer extends over a first side of the magnetic memory array. An electrically insulating layer is disposed between the permeable metal layer and the magnetic memory array.

13 Claims, 6 Drawing Sheets

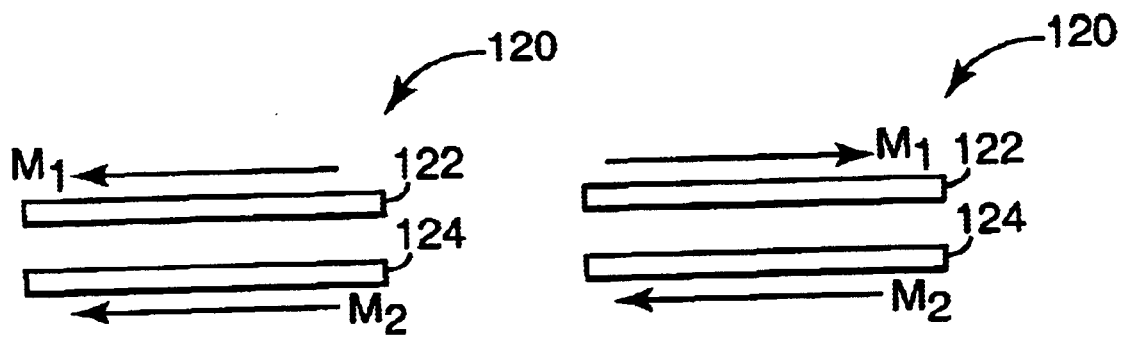
Fig. 2b
(PRIOR ART)
Fig. 2c
(PRIOR ART)
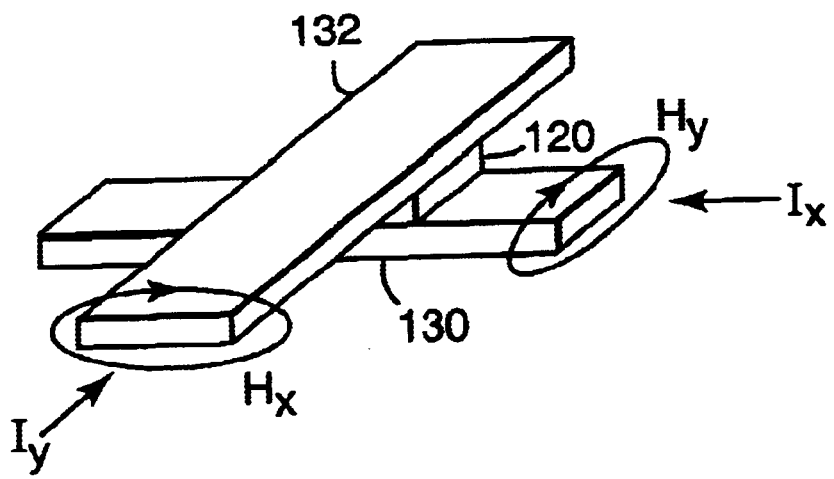
Fig. 3
(PRIOR ART)

MAGNETIC SHIELDING FOR MRAM DEVICES

THE FIELD OF THE INVENTION

The present invention generally relates to magnetic random access memory (MRAM) devices, and more particularly to a magnetic random access memory device having a shield member for shielding the magnetic memory cells from stray magnetic fields.

BACKGROUND OF THE INVENTION

An MRAM device includes an array of memory cells. The typical magnetic memory cell includes a layer of magnetic film in which the magnetization is alterable and a layer of magnetic film in which the magnetization is fixed or "pinned" in a particular direction. The magnetic film having alterable magnetization may be referred to as a data storage layer or sense layer and the magnetic film which is pinned may be referred to as a reference layer.

Conductive traces (commonly referred to as word lines and bit lines) are routed across the array of memory cells. Word lines extend along rows of memory cells, and bit lines extend along columns of memory cells. Because the word lines and bit lines operate in combination to switch the orientation of magnetization of the selected memory cell (i.e., to write the memory cell) the word lines and bit lines can be collectively referred to as write lines. Additionally, the write lines can also be used to read the logic values stored in the memory cell.

Located at each intersection of a word line and a bit line is a memory cell. Each memory cell stores a bit of information as an orientation of a magnetization. The orientation of magnetization of each memory cell will assume one of two stable orientations at any given time. These two stable orientations represent logic values of "1" and "0".

The orientation of magnetization of a selected memory cell may be changed by the application of an external magnetic field. The external magnetic field is created by supplying electrical current to a word line and a bit line which intersect at the selected memory cell. The electrical currents in the word and bit lines create magnetic fields (also referred to as "write fields") surrounding the energized word and bit lines that, when combined, can switch the orientation of magnetization (and thus the logic value) of the selected memory cell. Since no electric power is needed to maintain the memory state of the device, MRAM's are non-volatile.

Preferably, only the selected magnetic memory cell is subjected to both the word and bit line write fields. Other memory cells coupled to the particular word line preferably receive only the word line write field. Other magnetic memory cells coupled to the bit line preferably receive only the bit line write field.

The magnitudes of the word and bit line write fields are usually selected to be high enough so that the chosen magnetic memory cell switches its logic state when subjected to both fields, but low enough so that the other magnetic memory cells which are subject only to a single write field (from either the word line or the bit line) do not switch. The undesirable switching of a magnetic memory cell that receives only one write field is commonly referred to as "half-select" switching.

One problem encountered by MRAM devices is the presence of stray or external magnetic fields which emanate from sources other than the word and bit lines which are intended to write to a particular memory cell. Stray magnetic fields can originate from a multitude of sources, both within the MRAM device and external to the MRAM device. In some instances, stray magnetic fields may have a magnitude sufficient to switch the logic state of a memory cell, either as half-select switching or switching in the complete absence of a write field.

The problem of stray fields increases as the storage density of MRAM devices increases. As memory cells are packed closer together, the magnetic fields from adjacent memory cells and their associated write conductors exert a greater effect. Thus, reducing or eliminating the effects of stray magnetic fields becomes more important as storage densities increase.

SUMMARY OF THE INVENTION

A magnetic random access memory module comprises a magnetic memory array covered on a first side by a permeable metal layer. An electrically insulating layer is disposed between the permeable metal layer and the magnetic memory array. The permeable metal layer reduces the effects of stray magnetic fields on the magnetic memory array.

BRIEF DESCRIPTION OF THE DRAWINGS

FIGS. 2a through 2c illustrate the orientations of magnetization of active and reference magnetic films of a magnetic memory cell like that in FIGS. 1a and 1b.

FIG. 3 is a perspective view of a memory cell like that in FIGS, 1a and 1b showing the magnetic fields generated by currents flowing through the write lines.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
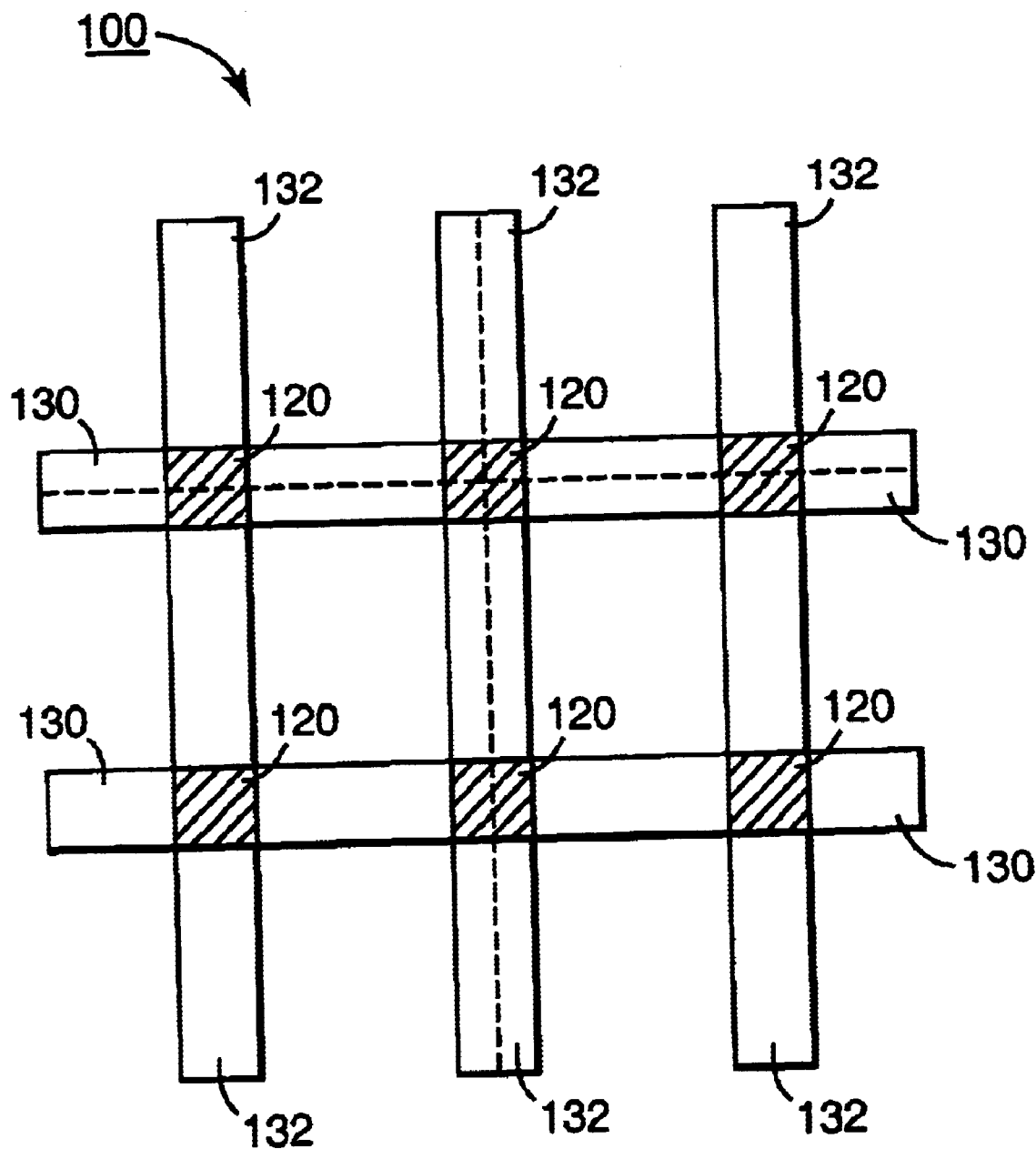
FIGS. 1a and 1b are top and perspective views of a simplified magnetic memory array as known in the prior art.
Figure 1B:
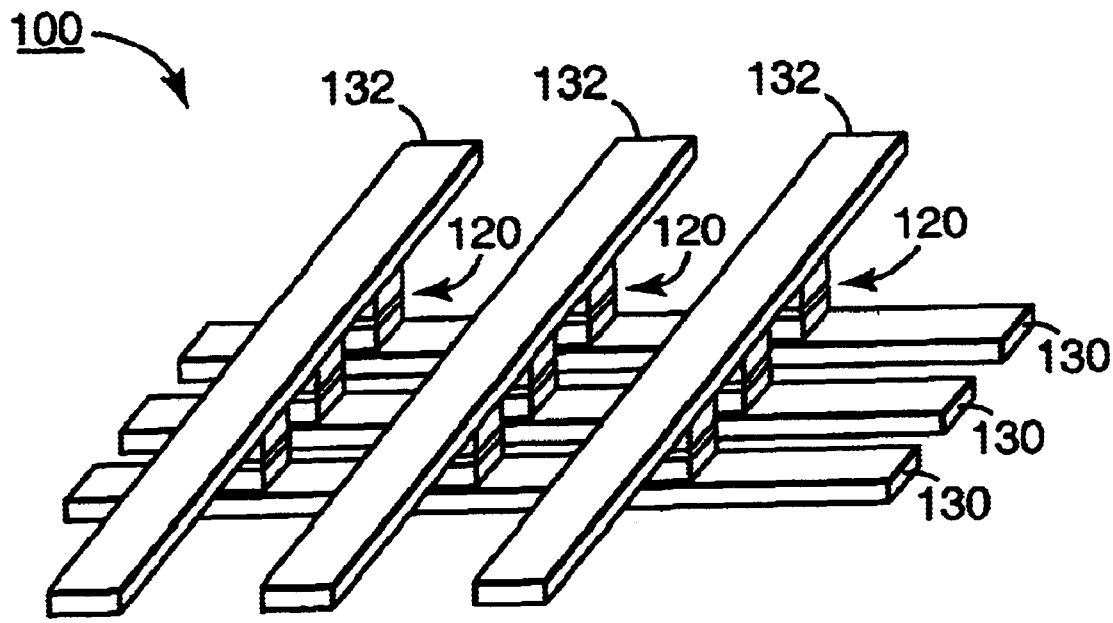

A top plan view of an example of a simplified MRAM array 100 is presented in FIG. 1. In FIG. 1 and all that follow, it is to be understood that for the sake of clarity the various components of the illustrated devices are not necessarily shown to scale. The MRAM array 100 includes memory cells 120, word lines 130, and bit lines 132. The memory cells 120 are positioned at each intersection of a word line 130 with a bit line 132. Typically, the word lines 130 and bit lines 132 are arranged in orthogonal relation to one another and the memory cells 120 are positioned in between the write lines (130, 132), as illustrated in FIG. 1b. For example, the bit lines 132 can be positioned above the memory cells 120 and the word lines 130 can be positioned below.

Figure 2A:
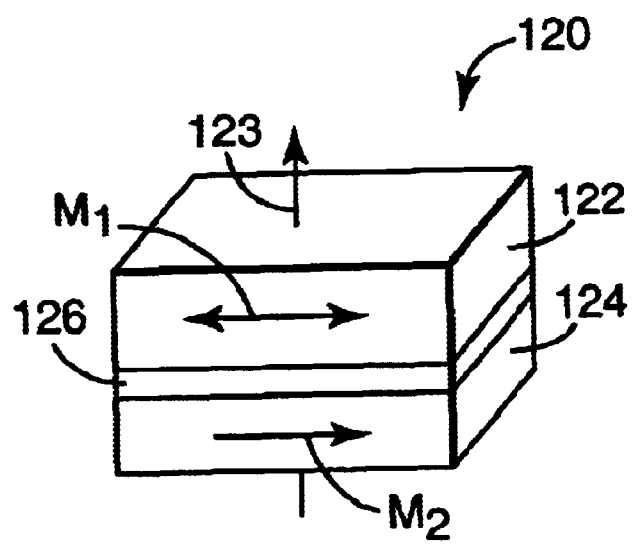

FIGS. 2a through 2c illustrate the storage of a bit of data in a single memory cell 120. In FIG. 2a, the memory cell 120 includes an active magnetic data film 122 (the sense layer) and a pinned magnetic film 124 (the reference layer) which are separated by a dielectric region 126 (the tunnel barrier). The orientation of magnetization in the sense layer 122 is not fixed and can assume two stable orientations is shown by arrow $M_1$. On the other hand, the pinned reference layer 124 has a fixed orientation of magnetization shown by arrow $M_2$. The sense layer 122 rotates its orientation of magnetization in response to electrical currents applied to the write lines (130, 132) during a write operation to the selected memory cell 120.

The first logic state of the data bit stored in as memory cell 120 is indicated when $M_1$ and $M_2$ are parallel to each other as illustrated in FIG. 2b. For instance, when $M_1$ and $M_2$ are parallel a logic "1" state is stored in the memory cell 120. Conversely, a second logic state is indicated when $M_1$ and $M_2$ are anti-parallel to each other as illustrated in FIG. 2c. Similarly, when $M_1$ and $M_2$ are anti-parallel a logic "0" state is stored in the memory cell 120. In FIGS. 2b and 2c the dialectic region 126 has been omitted. Although FIGS. 2a through 2c illustrate the sense layer 122 positioned above the reference layer 124, the reference layer 124 can be positioned above the sense layer 122.

The resistance of the memory cell 120 differs according to the orientations of $M_1$ and $M_2$. When $M_1$ and $M_2$ are anti-parallel, i.e., the logic "0" state, the resistance of the memory cell 120 is at its highest. On the other hand, the resistance of the memory cell 120 is at its lowest when the orientations of $M_1$ and $M_2$ are parallel, i.e., the logic "1" state. As a consequence, the logic state of the data bit stored in the memory cell 120 can be determined by measuring its resistance. The resistance of the memory cell 120 is reflected by a magnitude of a sense current 123 (referring to FIG. 2a) that flows in response to read voltages applied to the write lines (130, 132).

The memory cell structure shown in FIG. 2a may be referred to as a spin tunneling device in that electrical charge migrates through the tunnel barrier during read operations. This electrical charge migration through the tunnel barrier is due to a phenomenon known as to spin tunneling and occurs when a read voltages is applied to a magnetic memory cell.

In FIG. 3, the memory cell 120 is positioned between write lines 130, 132. For the purpose of clarity, the sense and reference layers 122, 124 are not shown in FIG. 3. The orientation of magnetization of the reference layer 122 is rotated in response to a current $I_x$ that generates a magnetic field $H_y$ and a current $I_y$ that generates a magnetic field $H_x$. The magnetic fields $H_x$ and $H_y$ act in combination to rotate the orientation of magnetization of the sense layer 122 in memory cell 120.

Each memory cell 120 has a switching characteristic for the sense layer 122. That is, a magnetic field having a minimum magnitude equal to $H_s$ is needed to flip the orientation of magnetization of sense layer 122 between its parallel and anti-parallel orientations. In designing an MRAM device, the magnitudes of the $H_x$ and $H_y$ fields are pre-selected so that the resulting field $H_w$ has a magnitude that is greater than or equal to the magnitude $H_s$ needed to write to the magnetic memory cell 120 (that is, to alter the orientation of magnetization of sense layer 122). It may be preferable that the magnitudes of the $H_x$ and $H_y$ fields be slightly larger than necessary to yield the $H_w$ field to provide a "write margin" in excess of $H_s$.

In practice, the switching characteristic of each memory cell 120 varies among the magnetic memory cells in the array due to manufacturing variations. In addition, the switching characteristic may be such that lower magnitudes of the $H_x$ or $H_y$ fields can cause switching in the magnetic memory cells 20b and 20d in the presence of a perpendicular field. This may be due to a variety of factors. For example, there may be manufacturing variations in the crystalline anisotropy value (Hk) of the sense layers of the magnetic memory cells. In addition, there may be variations in the thickness or shape of the magnetic layers of the magnetic memory cells. For example, photolithography process steps may produce rounded edges rather than rectangular edges on the data storage layers. Moreover, data storage layers having square rather than rectangular shapes may have significantly different switching characteristics.

The problems produced in MRAM devices by the presence of stray or external magnetic fields can be appreciated by recognizing that the orientation of magnetization of sense layer 122 may be switched when the total magnetic field to which the memory cell is subjected exceeds $H_s$. In some instances, stray magnetic fields may have a magnitude sufficient to switch the logic state of a memory cell when combined only with $H_x$ or $H_y$. A stray magnetic field could also exceed $H_s$ on its own and switch the logic state of a memory cell in the complete absence of a write field $H_x$ or $H_y$.

The problems caused by stray magnetic fields increase as memory cells are made smaller and are more densely packed into an array of memory cells and associated write conductors (referred to herein as a memory array). Each individual memory cell is subject to greater influence by the magnetic fields of adjacent memory cells and their associated write conductors. The possibility that a stray magnetic field may cause the total magnetic field of an individual memory cell to exceed $H_s$ increases. Thus, reducing or eliminating the effects of stray magnetic fields becomes increasingly important as memory cells shrink in size and the storage densities of memory arrays increase.

In the present invention, the effect of stray magnetic fields is reduced or eliminated by positioning a permeable metal shield layer in close proximity to the memory cells, either individually or in a memory array, to shield the memory cells from the stray fields. Magnetic flux lines, like electrical currents, will always follow the path of least resistance. In magnetic terms, this means that flux lines will follow the path of greatest permeance (lowest reluctance). So long as the material through which the flux is passing does not reach its saturation level, the material will substantially contain the flux lines passing through it. In this manner, a stray magnetic field is prevented from reaching and interfering with the switching of a memory cell in a memory array.

Figure 4:
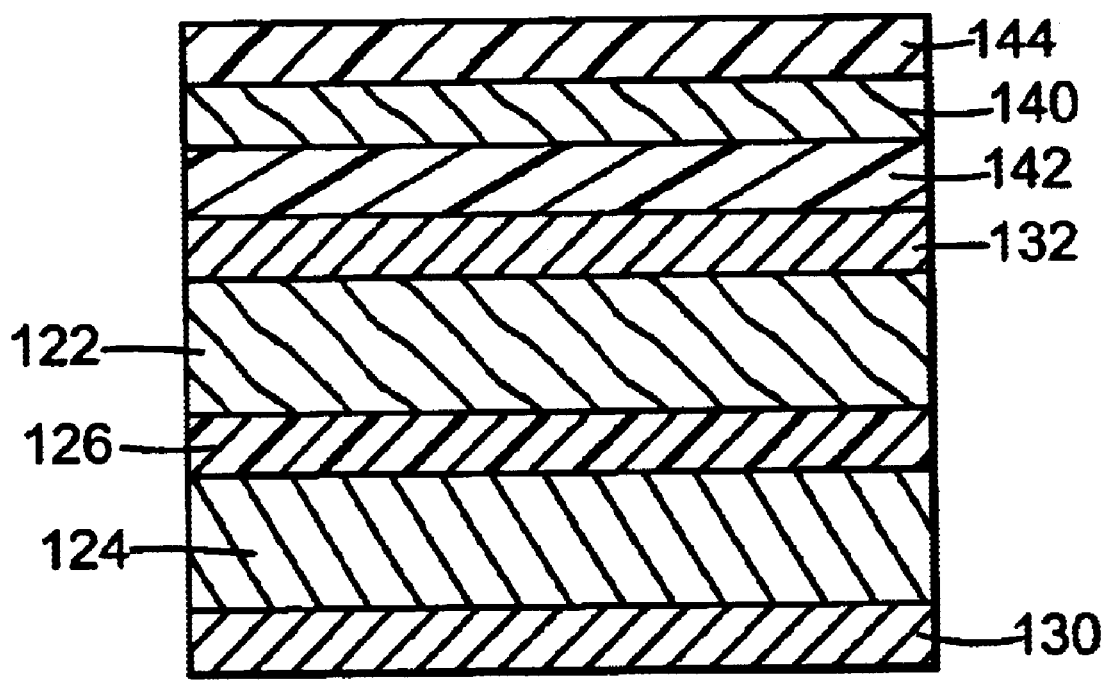
FIG. 4 is a cross sectional representation of a memory module according to an embodiment of the invention.

FIG. 4 schematically illustrates one embodiment of the invention in which a memory cell 120, having sense layer 122, reference layer 124, tunnel barrier 126 and write lines 130, 132 is shielded by magnetically permeable (or simply "permeable") metal shield layer 140. Because permeable metal shield layer 140 is metallic, it is also electrically conductive and is separated from write lines 130, 132 by an electrically insulating layer 142. Insulating layer 142 may be formed of, for example, $SiO_2$, tantalum, or any other suitable electrically insulating material. A passivation or capping layer 144, formed of a material like that used for insulating layer 142, may optionally be provided over permeable metal shield layer 140.

To maximize the effectiveness of permeable metal shield layer 140 against stray magnetic fields, shield layer 140 should be positioned as close as possible to memory cell 120. In one embodiment, the thicknesses of write conductors 130, 132 and insulating layer 142 are such that permeable metal layer 140 is spaced from memory cell 120 by a distance of less than 10 microns. However, permeable metal shield layer 140 may be positioned at greater distances and still be effective. Although permeable metal shield layer 140 and insulating layer 142 are shown in FIG. 4 adjacent sense layer 122 and write line 132, layers 140, 142 could also be positioned adjacent the opposite side of memory cell 120, or on both sides of memory cell 120. This is true for all embodiments of the invention shown and discussed herein.

Although FIG. 4 illustrates only a single memory cell 120, it is anticipated that a plurality of memory cells 120 will be formed into a memory array, and permeable metal shield layer 140 will extend over the entire memory array in a manner consistent with that illustrated in FIG. 4.

As noted above, so long as permeable metal shield layer 140 through which the flux is passing does not reach its saturation level, the shield layer 140 will substantially contain the flux lines passing through it. The saturation level of the permeable metal shield layer 140 may be increased by increasing the size of the shield layer (area and thickness) relative to the size of the memory cell or array, and/or by using a material having a higher permeability to form shield layer 140. For example, where the size of permeable metal shield layer 140 is close to that of the memory array, it is desirable that permeable metal shield layer 140 is formed from a material having a permeability higher than that of the magnetic layers of memory cells 120. If the size of permeable metal shield layer 140 is much greater than that of the memory array, the permeable metal shield layer 140 may be formed from a material having a permeability closer to the permeability of the magnetic layers of memory cells 120.

Figure 5A:
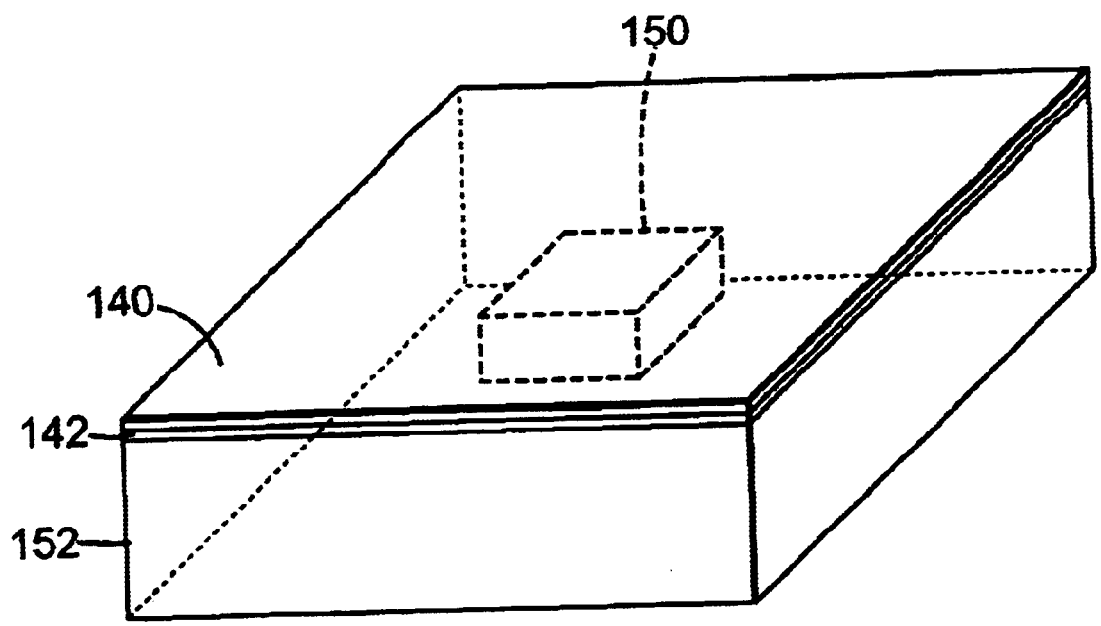
FIGS. 5a and 5b are perspective and top views of a memory module according to another embodiment of the invention.
Figure 5B:
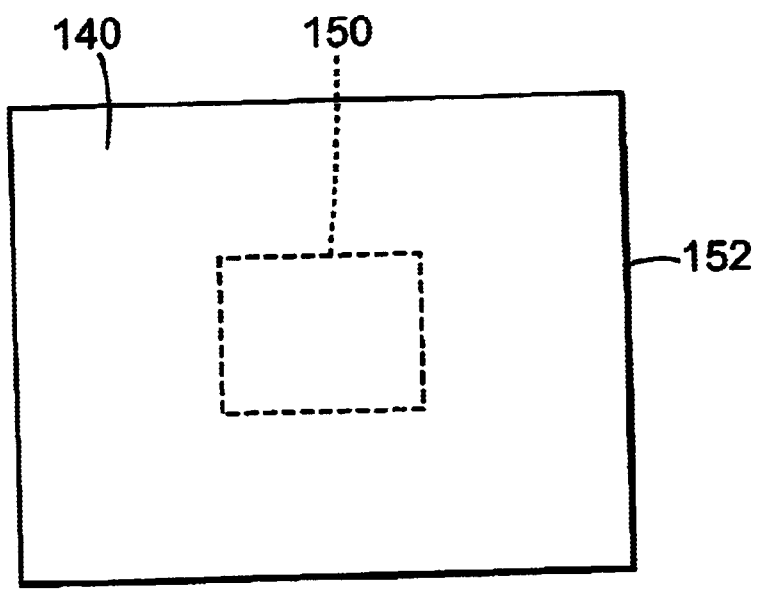

In one embodiment schematically illustrated in FIGS. 5a and 5b, a magnetic memory array 150 is positioned within a package 152 which provides the electronics and input/output means for controlling operation of the memory array 150. Memory array 150 may include multiple layers of memory cells and associated write lines. In alternate embodiments of the invention, each layer of memory cells may have its own associated shield layer 140. The package may, for example, have a length and width which are each more than twice those of memory array 150. It is thus possible to extend the permeable metal shield layer 140 (and insulating layer 142) over substantially the entire area of package 152. Memory array 150 would then be provided with shield layers 140 having an area over four times larger than the area of memory array 150.

In one embodiment of the invention, permeable metal shield layer 140 is a soft magnetic material having high permeability ($\mu$) and low anisotropy (Hk). As known to those skilled in the art, soft magnetic materials are those which exhibit magnetic properties only when they are subject to a magnetizing force, such as the magnetic field created when current is passed through wire surrounding a soft magnetic core. Because the orientation of a stray magnetic field will typically not be known, and in fact may vary from source to source, it may also be desirable to form the permeable metal shield layer from an isotropic material. In this manner, the effect of stray magnetic fields having any orientation may be addressed.

The permeable metal shield layer may be formed of, for example, an alloy of Ni, Fe, and/or Co, or Co alone. Those skilled in the art will recognize other suitable metals and alloys which may be used as well. In one embodiment of the invention, when the size of the permeable metal shield layer is sufficiently greater than the size of the memory array, the material may have a permeability as low as 10. In another embodiment of the invention, when the size of permeable metal shield layer is sufficiently greater than the size of the memory array, the permeable metal shield layer may have an anisotropy as high as 100 Oe.

Permeable metal layer 140 may be attached on insulating layer 142 in any suitable manner known in the art. Examples of methods which may be used to attach metal layer 140 include sputtering and spin coating. The permeable metal layer 140 can be made isotropic by, for example, depositing it in the presence of a rotating magnetic field, or by annealing the permeable metal layer 140 in the presence of a rotating magnetic field. Annealing the previously deposited permeable metal layer 140 in the presence of a rotating magnetic field may be accomplished by either rotating the assembly having layer 140 in a uniform stationary field, or rotating the magnetic field itself (such as by rotating a permanent magnet) in the annealing station. The annealing temperature of permeable metal layer 140 is preferably lower than the annealing temperature of the magnetic materials used in memory cell 120. This is done to avoid altering the magnetic orientation of magnetic layers 122, 124 while annealing permeable metal shield layer 140.

Figure 6:
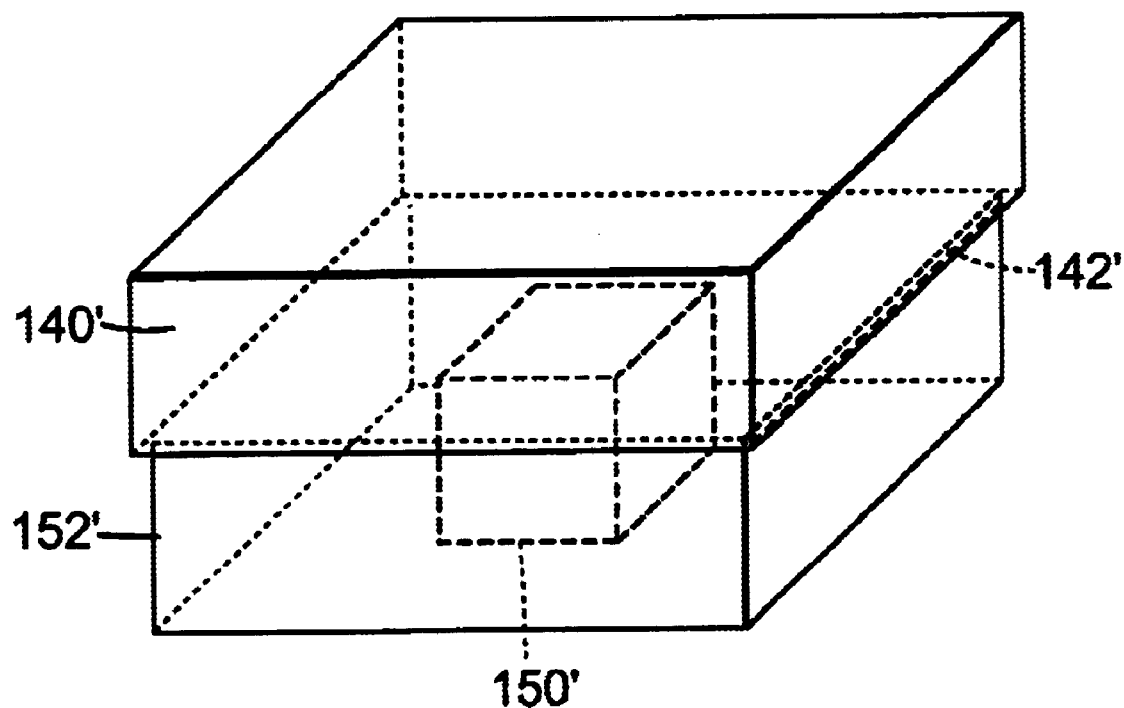
FIG. 6 is a perspective view of a memory module according to another embodiment of the invention.

In another embodiment of the invention, permeable metal layer 140 is a separate layer which is attached to a completed MRAM module or package. For example, as schematically illustrated in FIG. 6, a memory array 150' is constructed as part of a package 152' which provides the electronics and input/output means for controlling operation of the memory array 150'. Memory array 150' may include multiple layers of memory cells and associated write lines, as with memory array 150 above. However, unlike memory array 150, in memory array 150' each layer of memory cells does not have its own associated shield layer 140. Rather, after package 152' is constructed, a permeable metal layer 140' is secured to one or more surfaces of package 152'. Permeable metal layer 140' may, for example, be a thin foil of high permeability material, such a Mumetal® or Permalloy® which is secured to package 152' by a suitable adhesive. The material of insulating layer 142' may itself be an adhesive material used to secure permeable metal layer 140' to package 152'.

The thicknesses of the memory array 150' and package 152' are very small compared to their length and width (FIGS. 5a and 6 show greatly exaggerated thicknesses), and the thickness of permeable metal layer 140' is large compared to the thickness of memory array 150' (by several orders of magnitude). Thus, permeable metal layer 140' may be secured to the surface of package 152' and still provide suitable shielding from stray magnetic fields.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electro-mechanical, electrical and chemical arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents and thereof.

What is claimed is:

1. A magnetic random access memory module comprising:
   a magnetic memory array;
   a permeable metal layer extending over a first side of the magnetic memory array; and
   an electrically insulating layer disposed between the magnetic memory array and the permeable metal layer.

2. The memory module of claim 1, wherein the permeable metal layer comprises a soft magnetic material.

3. The memory module of claim 2, wherein soft magnetic material is selected from the group consisting of iron, nickel, cobalt, alloys of iron, alloys of nickel and alloys of cobalt.

4. The memory module of claim 1, wherein the permeable metal layer has a permeability of greater than 10.

5. The memory module of claim 1, wherein the permeable metal layer has an anisotropy of less than 100 Oe.

6. The memory module of claim 1, wherein the permeable metal layer is isotropic.

7. The memory module of claim 1, wherein the magnetic memory array comprises:
   a plurality of magnetic memory cells; and
   a pair of write conductors operatively positioned adjacent each of the plurality of magnetic memory cells.

8. The memory module of claim 7, wherein each of the plurality of magnetic memory cells comprises:
   a reference layer having a pinned magnetization;
   a sense layer having an alterable magnetization; and
   a dielectric layer separating the reference layer and the sense layer.

9. The memory module of claim 1, wherein the permeable metal layer has an area larger than an area of the magnetic memory array.

10. The memory module of claim 9, wherein the area of the permeable metal layer is at least twice the area of the magnetic memory array.

11. The memory module of claim 7, wherein the spacing between the permeable metal layer and the plurality of memory cells is 10 microns or less.

12. The memory module of claim 1, wherein the permeable metal layer has an annealing temperature lower than an annealing temperature of the magnetic memory array.

13. A magnetic random access memory module comprising:
   a plurality of magnetic memory cells;
   a plurality of write conductors, each of the write conductors positioned adjacent an associated one of the plurality of magnetic memory cells;
   an isotropic magnetically permeable metal layer extending continuously over at least one side of the magnetic memory cells and associated write conductors, an
   an electrically insulating layer disposed between the permeable metal layer and the write conductors.

* * * * *